(12) United States Patent
Lin et al.

(10) Patent No.: US 9,568,552 B2
(45) Date of Patent: Feb. 14, 2017

(54) LOGIC BUILT-IN SELF-TEST WITH HIGH TEST COVERAGE AND LOW SWITCHING ACTIVITY

(71) Applicant: Mentor Graphics Corporation, Wilsonville, OR (US)

(72) Inventors: Xijiang Lin, West Linn, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 124 days.

(21) Appl. No.: 14/298,663

(22) Filed: Jun. 6, 2014

(65) Prior Publication Data

US 2014/0365840 A1    Dec. 11, 2014

Related U.S. Application Data

(60) Provisional application No. 61/832,116, filed on Jun. 6, 2013.

(51) Int. Cl.
*G01R 31/28*    (2006.01)
*G01R 31/3185*  (2006.01)
*G01R 31/3183*  (2006.01)

(52) U.S. Cl.
CPC ............. *G01R 31/318575* (2013.01); *G01R 31/318547* (2013.01); *G01R 31/318385* (2013.01)

(58) Field of Classification Search
CPC .............. G01R 31/318575; G01R 31/318547; G01R 31/318385
See application file for complete search history.

(56) References Cited

U.S. PATENT DOCUMENTS

2002/0124217 A1*  9/2002  Hiraide .............. G06F 11/27
                                                714/726

OTHER PUBLICATIONS

H.-J. Wunderlich, "Multiple Distributions for Biased Random Test Patterns," in Int. Test. Conf., 1988, pp. 236-244.
I. Pomeranz, and S. M. Reddy, "3-Weighted Pseudo-Random Test Generation Based on a Deterministic Test Set," in IEEE Trans. on CAD, Jul. 1993, pp. 1050-1058.
S. Wang, "Low Hardware Overhead Scan Based 3-Weight Weighted Random BIST," in Int. Test Conf., 2001, pp. 868-877.

(Continued)

*Primary Examiner* — Sam Rizk
(74) *Attorney, Agent, or Firm* — Klarquist Sparkman, LLP (57) ABSTRACT

The test circuitry according to various aspects of the presently disclosed techniques comprises: low-toggling pseudo-random test pattern generation circuitry, wherein the low-toggling pseudo-random test patterns generated by the low-toggling pseudo-random test pattern generation circuitry causing switching activity during scan shift cycles lower than pseudo-random test patterns generated by a pseudo-random pattern generator; scan chains configurable to shift in a low-toggling pseudo-random test pattern generated by the low-toggling pseudo-random test pattern generation circuitry; background chains configurable to shift in a background test pattern; and weight insertion circuitry configurable to modify a plurality of bits in the low-toggling pseudo-random test pattern based on bits in the background test pattern to form a weighted pseudo-random test pattern.

17 Claims, 7 Drawing Sheets

(56) References Cited

OTHER PUBLICATIONS

S. Ghosh, E. Macdonald, S. Basu, and N. A. Touba, "Low-Power Weighted Pseudo-Random BIST Using Special Scan Cells," in GLSVLSI, Apr. 2004.
S. Wang and S. K. Gupta, "LT-RTPG: A New Test-Per-Scan BIST TPG for Low Heat Dissipation," in Int. Test Conf., 1999, pp. 85-94.
M. Nourani, M. Tehranipoor, and N. Ahmed, "Low-Transition Test Pattern Generation for BIST-Based Application," in IEEE Tran. on Comp., vol. 57, No. 3, Mar. 2008, pp. 303-315.
X. Lin, and J. Rajski, "Adaptive Low Shift Power Test Pattern Generator," in Asian Test Symp., 2010, pp. 355-360.
J. Rajski, J. Tyszer, G. Mrugalski, and B. Nadeau-Dostie, "Test Generator with Preselected Toggling for Low Power Build-In Self-Test," in VLSI Test Symp., 2012, pp. 1-6.[.
X. Lin, and J. Rajski, "On Utilizing Test Cube Properties to Reduce Test Data Volume Further," in Asian Test Symp., 2012, pp. 83-88.[.

\* cited by examiner

Flow chart
500

LOGIC BUILT-IN SELF-TEST WITH HIGH TEST COVERAGE AND LOW SWITCHING ACTIVITY

RELATED APPLICATIONS

This application claims priority to U.S. Provisional Patent Application No. 61/832,116, entitled "Improving Test Coverage in Low Shift Power Logic BIST," filed on Jun. 6, 2013, and naming Xijiang Lin et al. as inventors, which application is incorporated entirely herein by reference.

FIELD OF THE DISCLOSED TECHNIQUES

The presently disclosed techniques relates to the field of circuit testing technology. Various implementations of the disclosed techniques may be particularly useful for logic built-in self-test (LBIST).

BACKGROUND OF THE DISCLOSED TECHNIQUES

Built-in self-test (BIST) is a design-for-test methodology that permits a circuit to test itself using embedded test logic. When the circuit-under-test is a logic circuit, the BIST is referred to as logic built-in self-test (LBIST). Comparing with traditional automatic test pattern generation (ATPG), LBIST does not rely on pre-computed test patterns to achieve high test coverage. Test stimuli in LBIST are instead generated by a pseudo-random pattern generator. Examples of pseudo-random pattern generators include linear feedback shift register (LFSR) and cellular automata (CA).

LBIST is a scan-based test. Like other scan-based test technique, circuit testing may cause excessive circuit switching activity compared to normal operation of the circuit. Such excessive switching activity can occur during scan chain shift cycles, capture cycles or both. Higher switching activity leads to higher power dissipation and higher peak supply currents. High power dissipation may in turn lead to hot spots that could damage the circuit. Excessive peak supply currents may cause IR-drop and di/dt problem, which, in turn, causes circuit-under-test to fail during testing due to additional gate delay.

Several techniques have been proposed in the past to reduce switching activity caused by scan shift. For example, logic gates may be inserted to hold scan cell outputs at constant values during scan shift cycles. These extra logic gates may, however, degrade circuit performance. Some other techniques are based on low toggling pseudo-random test patterns. The probability of any bit in conventional pseudo-random test patterns being "0" (or "1") is 50%. By contrast, some adjacent bits in low toggling pseudo-random test patterns are highly correlated, resulting in low switching activity during scan shift cycles. The following papers, which are incorporated herein by reference, include examples of generating low toggling pseudo-random test patterns: S. Wang and S. K. Gupta, "LT-RTPG: A New Test-Per-Scan BIST TPG for Low Heat Dissipation," in Int. Test Conf., 1999, pp. 85-94; M. Nourani, M. Tehranipoor, and N. Ahmed, "Low-Transition Test Pattern Generation for BIST-Based Application," in IEEE Tran. on Comp., Vol. 57, No. 3, March 2008, pp. 303-315; X. Lin, and J. Rajski, "Adaptive Low Shift Power Test Pattern Generator," in Asian Test Symp., 2010, pp. 355-360; and J. Rajski, J. Tyszer, G. Mrugalski, and B. Nadeau-Dostie, "Test Generator with Preselected Toggling for Low Power Build-In Self-Test," in VLSI Test Symp., 2012, pp. 1-6. While reducing power consumption during scan shift cycles, the use of low toggling pseudo-random test patterns tends to affect test coverage because the randomness of bit values in low toggling pseudo-random test patterns are decreased.

Weighted random pattern generation techniques have been employed to improve detection probability of conventional pseudo-random test patterns. In this approach, outputs of a conventional pseudo-random pattern generator are intentionally biased to create test sequence with non-uniform distributed ones and zeros for some selected bits. As noted above, bits in conventional pseudo-random test patterns have equal probability values of being "0" and "1". Bits in weighted random test patterns, by contrast, are selected to be assigned different probability values of being "1" and "0" based on faults to be detected. The probability value of being "0" (or "1") for a bit is referred to as the weight value of the bit. Different faults may require different biases of the test stimulus combination. Thus, multiple weight assignments are often required to detect majority of faults by a small number of random test patterns.

Various techniques may be used to select bits and their weight values to achieve high test coverage. One technique based on analysis of fault detection probabilities is disclosed by H.-J. Wunderlich, "Multiple Distributions for Biased Random Test Patterns," in Int. Test. Conf., 1988, pp. 236-244, which is incorporated herein by reference. Another technique is based on analysis of deterministic test patterns generated for the same circuit. In this technique, ones and zeros of a bit in a set of deterministic test patterns may be counted to derive the weight value for the bit. Three published papers, I. Pomeranz, and S. M. Reddy, "3-Weighted Pseudo-Random Test Generation Based on a Deterministic Test Set," in IEEE Trans. on CAD, July 1993, pp. 1050-1058, S. Wang, "Low Hardware Overhead Scan Based 3-Weight Weighted Random BIST," in Int. Test Conf., 2001, pp. 868-877, and S. Ghosh, E. Macdonald, S. Basu, and N. A. Touba, "Low-Power Weighted Pseudo-Random BIST Using Special Scan Cells," in GLSVLSI, April 2004, are examples of using this technique, which are incorporated herein by reference. In these examples, a NOT, AND and OR network is inserted between outputs of a conventional pseudo-random pattern generator and serial inputs of scan chains to produce bit values with weight values different from 50%. To load these bit values to corresponding scan cells, control logic based on an on-chip ROM storing weight value and assignment information is employed.

Two of the above-mentioned articles (S. Wang, et al. and S. Ghosh, et al.) describe how both high test coverage and low switching activity can be achieved for a LBIST-based application by coupling a weighted random pattern generation technique with a low toggling pseudo-random test pattern technique. It is desirable, however, to develop techniques that can obtain similar or better results without using an on-chip ROM.

BRIEF SUMMARY OF THE DISCLOSED TECHNIQUES

Various aspects of the presently disclosed techniques relate to logic built-in self-test techniques for increasing test coverage and reducing scan-shift-induced switching activity. In another aspect, there is an integrated circuit, comprising: low-toggling pseudo-random test pattern generation circuitry, wherein the low-toggling pseudo-random test patterns generated by the low-toggling pseudo-random test pattern generation circuitry causing switching activity during scan shift cycles lower than pseudo-random test patterns generated by a pseudo-random pattern generator; scan chains configurable to shift in a low-toggling pseudo-random test pattern generated by the low-toggling pseudo-random test pattern generation circuitry; background chains configurable to shift in a background test pattern; and weight insertion circuitry configurable to modify a plurality of bits in the low-toggling pseudo-random test pattern based on bits in the background test pattern to form a weighted pseudo-random test pattern.

The low-toggling pseudo-random test pattern generation circuitry may comprise: a pseudo-random pattern generator; and circuitry for converting pseudo-random test patterns generated by the pseudo-random pattern generator to the low-toggling pseudo-random test patterns. The background test pattern may also be generated by the pseudo-random pattern generator.

The plurality of bits may be determined based on weight values obtained based on analyzing fault detection probabilities or deterministic test patterns. The modifying performed by the weight insertion circuitry may comprise replacing a bit in the plurality of bits with a bit in the background test pattern if the weight value of the bit is 50% or with a bit outputted from a logic operation that combines two or more bits in the background test pattern if the weight value of the bit is not 50%. The modifying performed by the weight insertion circuitry may take place in a last shift cycle of a shift-in operation of the scan chains.

In another aspect, there are one or more processor-accessible media storing processor-executable instructions for causing one or more processors to create a design of the integrated circuit, the integrated circuit comprising: low-toggling pseudo-random test pattern generation circuitry, wherein the low-toggling pseudo-random test patterns generated by the low-toggling pseudo-random test pattern generation circuitry causing switching activity during scan shift cycles lower than pseudo-random test patterns generated by a pseudo-random pattern generator; scan chains configurable to shift in a low-toggling pseudo-random test pattern generated by the low-toggling pseudo-random test pattern generation circuitry; background chains configurable to shift in a background test pattern; and weight insertion circuitry configurable to modify a plurality of bits in the low-toggling pseudo-random test pattern based on bits in the background test pattern to form a weighted pseudo-random test pattern.

In still another aspect, there is a method, comprising: shifting a low-toggling pseudo-random test pattern into scan chains, the low-toggling pseudo-random test pattern being generated by low-toggling pseudo-random test pattern generation circuitry, low-toggling pseudo-random test patterns generated by the low-toggling pseudo-random test pattern generation circuitry causing switching activity during scan shift cycles lower than pseudo-random test patterns generated by a pseudo-random pattern generator; modifying a plurality of bits in the low-toggling pseudo-random test pattern based on a background test pattern stored in background scan chains to form a weighted pseudo-random test pattern; and launching the weighted pseudo-random test pattern to test a circuit-under-test.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the presently disclosed techniques relate to logic built-in self-test techniques for increasing test coverage and reducing scan-shift-induced switching activity. In the following description, numerous details are set forth for the purpose of explanation. However, one of ordinary skill in the art will realize that the disclosed techniques may be practiced without the use of these specific details. In other instances, well-known features have not been described in details to avoid obscuring the presently disclosed techniques.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "determine," "modify" and "convert" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Figure 1:
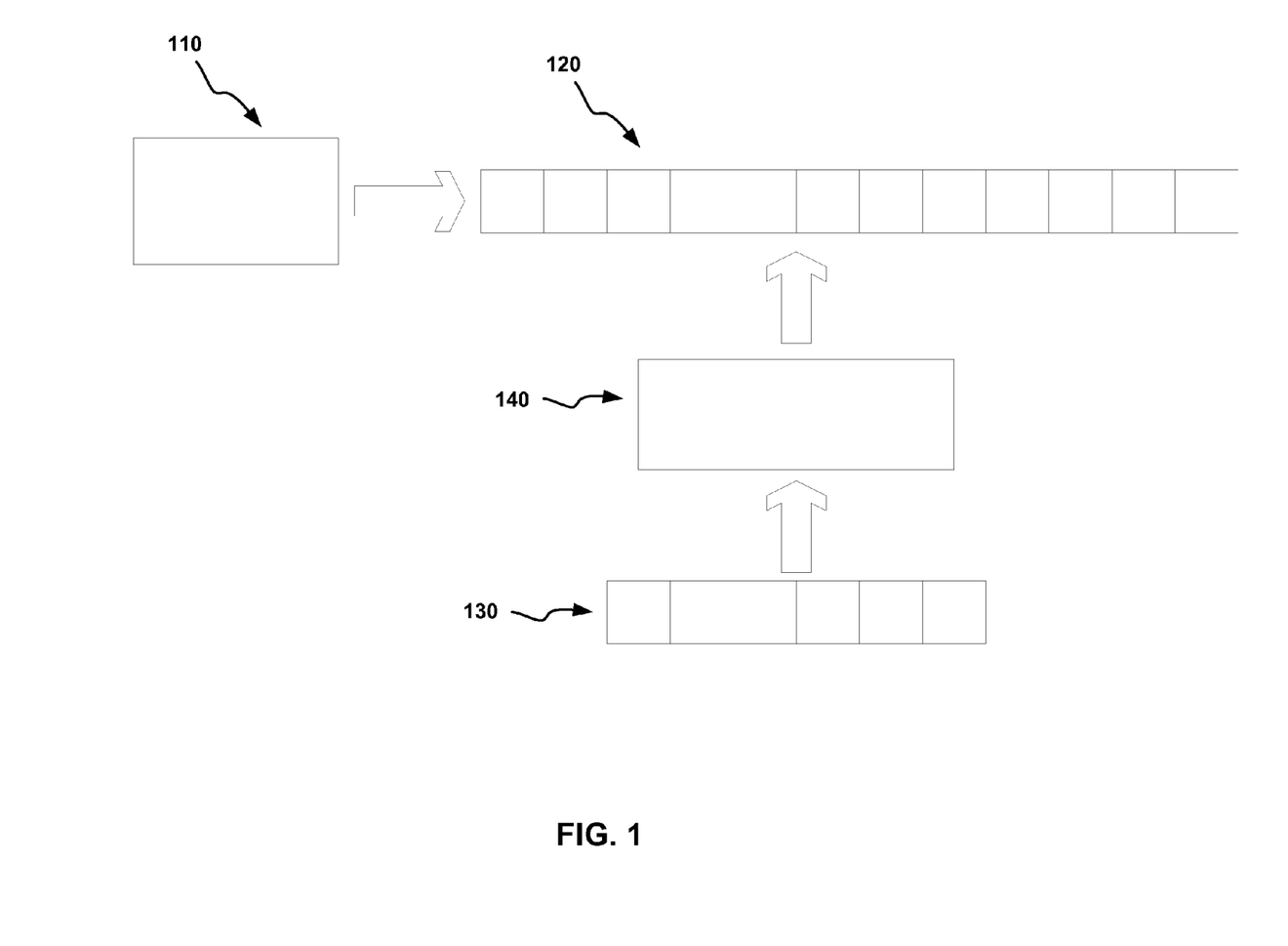
FIG. 1 illustrates a block diagram of test circuitry according to various embodiments of the presently disclosed techniques.

FIG. 1 illustrates a block diagram of test circuitry according to various embodiments of the presently disclosed techniques. The test circuitry comprises low-toggling pseudo-random test pattern generation circuitry 110, scan chains 120, background scan chains 130 and weight insertion circuitry 140. The low-toggling pseudo-random test pattern generation circuitry 110 generates low-toggling pseudo-random test patterns. Each of the low-toggling pseudo-random test patterns can be shifted into the scan chains 120. During scan shift cycles, the low-toggling pseudo-random test patterns cause switching activity lower than pseudo-random test patterns generated by a pseudo-random pattern generator. The background scan chains 130 are configurable to shift in a background test pattern. The weight insertion circuitry 140 is configurable to modify a plurality of bits in the low-toggling pseudo-random test pattern based on bits in the background test pattern to form a weighted pseudo-random test pattern. During scan capture cycle(s), the weighted pseudo-random test pattern is launched to test the circuit-under-test.

Figure 2:
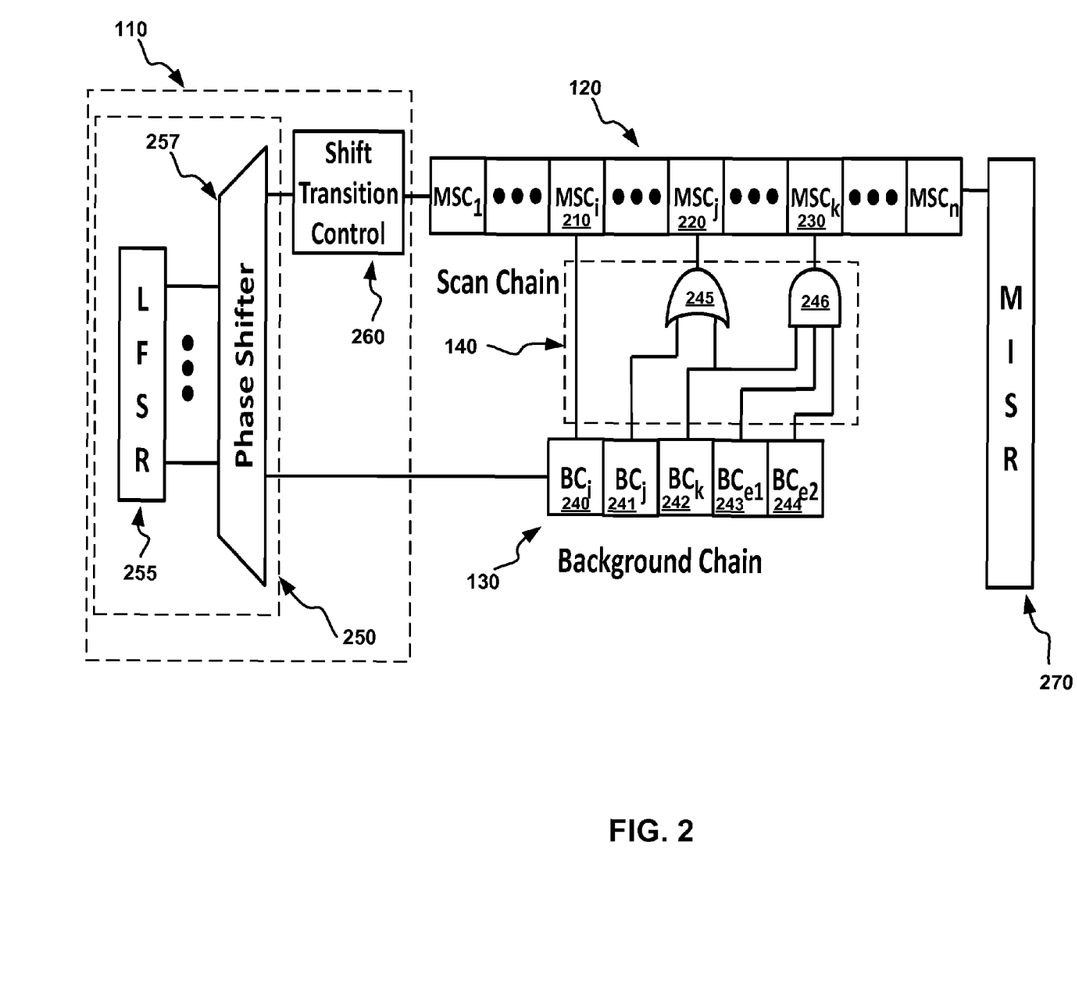
FIG. 2 illustrates an example of a more detailed block diagram of the test circuitry in FIG. 1 according to some embodiments of the presently disclosed techniques.

FIG. 2 illustrates an example of a more detailed block diagram of the test circuitry in FIG. 1 according to some embodiments of the presently disclosed techniques. In this example, the low-toggling pseudo-random test pattern generation circuitry 110 comprises a pseudo random pattern generator 250 and circuitry 260 for converting pseudo-random test patterns to low-toggling pseudo-random test patterns. The pseudo random pattern generator 250 comprises a LFSR 255 (linear feedback shift register) and a phase shifter 257. The pseudo random test patterns generated by the pseudo random pattern generator 250 are used not only for generating the low-toggling pseudo-random test patterns but also for loading the background scan chains 130.

Three scan cells (210, 220 and 230) on the main scan chains 120 are coupled to the background scan chains 130 through the weight insertion circuitry 140. In particular, the scan cell 210 is directly driven by a scan cell 240 on the background scan chains 130, which ensures the value of the scan cell 210 has a 50% of chance being either "0" or "1"; the scan cell 220 is coupled to scan cells 241 and 242 on the background scan chains 130 through an OR gate 245, which biases the value of the scan cell 220 to 1 with a weight value of 75% (or 25% for being 0); and the scan cell is coupled to scan cells 242, 243 and 244 on the background scan chains 130 through an AND gate 246, which biases the value of the scan cell 230 to 0 with a weight value of 87.5% (or 12.5% for being 1).

It should be noted that both the scan chains 120 and the background scan chains 130 typically contains multiple scan chains (especially the former) even though only one scan chain is shown for each of them in FIG. 2. It should also be noted that the shown internal structure of the weight insertion circuitry 140 is for illustration only. For example, different weight values may be derived by adding background scan cell inputs and/or logic gates. A person of ordinary skill in the art would appreciate that other logic structures may be used to implement the weight insertion circuitry 140.

FIG. 2 also displays a MISR (multiple-input signature register) 270. The MISR 270 compacts test responses to generate a test signature.

Figure 3:
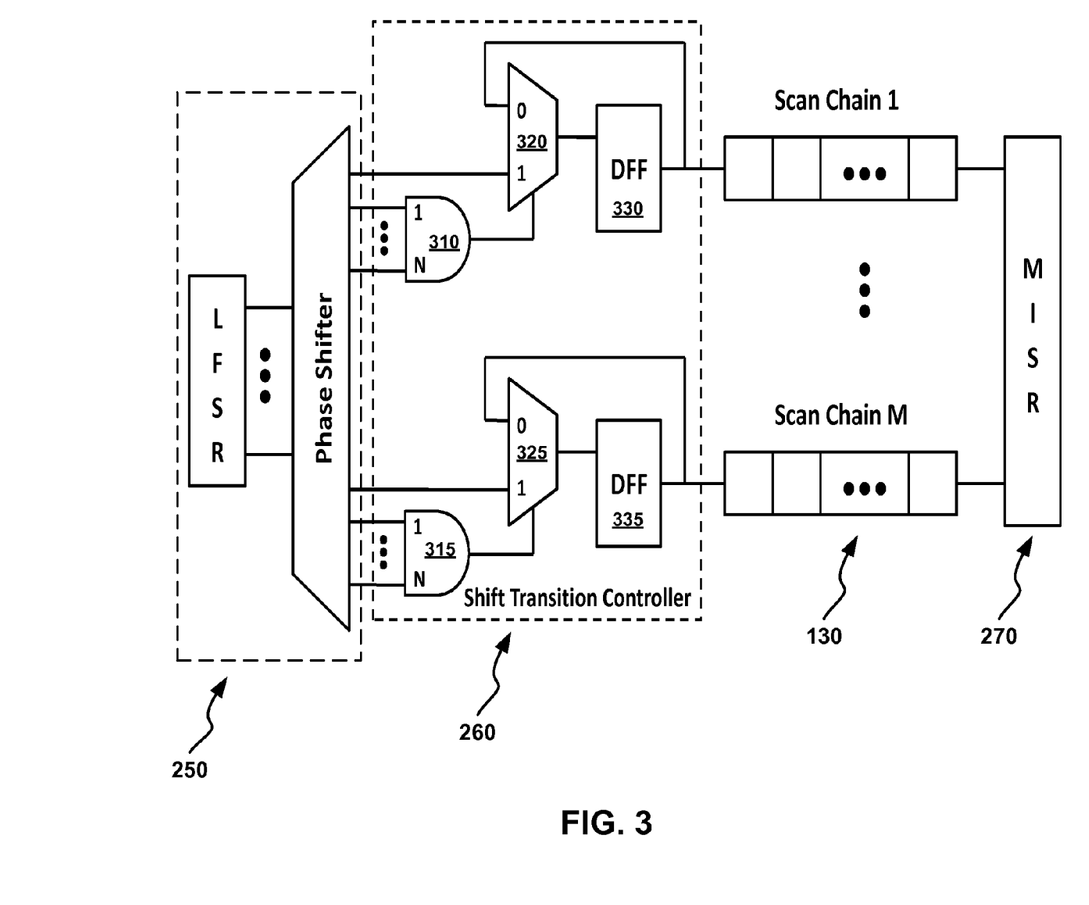
FIG. 3 illustrates an example how circuitry for converting pseudo-random test patterns generated to low-toggling pseudo-random test patterns may be constructed according to some embodiments of the presently disclosed techniques.

FIG. 3 illustrates an example how circuitry for converting pseudo-random test patterns generated to low-toggling pseudo-random test patterns may be constructed according to some embodiments of the presently disclosed techniques. The circuit shown in the figure includes the four units shown in FIG. 2: the pseudo random pattern generator 250, the circuitry 260 for converting pseudo-random test patterns to low-toggling pseudo-random test patterns, the main scan chains 120 and the MISR 270. The background scan chains 130 and the weight insertion circuitry 140 are not shown. The circuitry 260 includes identical subunits, each of which includes an AND gate (310/315), a multiplexer (320/325), and a D-type flip-flop (330/335). Each of these identical subunits has a single output coupled to the serial input of a scan chain in the main scan chains 120 and multiple inputs coupled to multiple outputs of the pseudo random pattern generator 250. When the AND gate (310/315) has a single input, the probability of the shift-in transitions is decreased by 50%. For each additional AND gate input, the shift-in transitions are reduced by another 50%.

Figure 4:
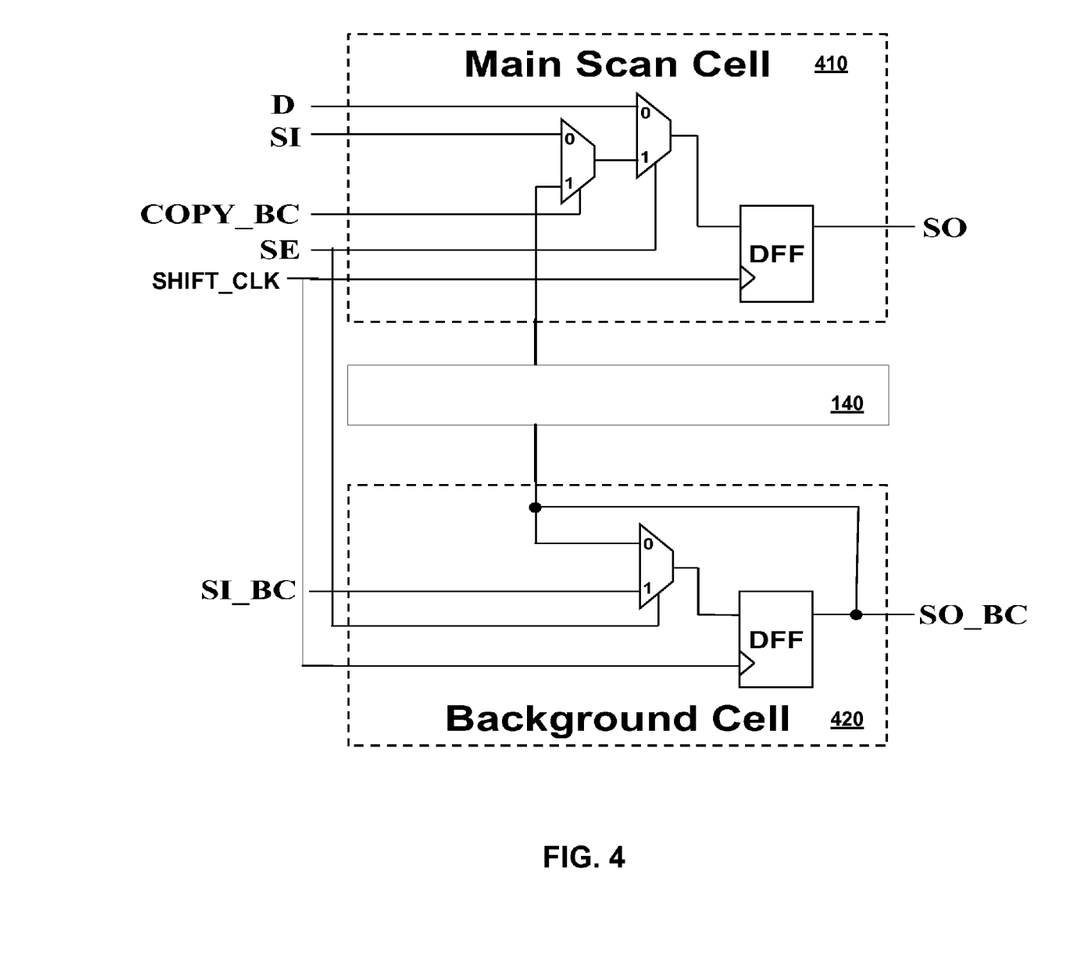
FIG. 4 illustrates an example how scan cells in main scan chains and background scan chains may be constructed according to some embodiments of the presently disclosed techniques.

FIG. 4 illustrates an example how scan cells in the main scan chains 120 and the background scan chains 130 may be constructed according to some embodiments of the presently disclosed techniques. Only a scan cell 410 on the main scan chains 120 and a scan cell 420 on the background scan chains 130 are shown in the figure. Between them is the weight insertion circuitry 140. During the scan shift operation, both the main scan chains 120 and the background chains 140 may load random test stimulus simultaneously with SE set to 1. COPY_BC stays at 0 during shift except the last shift cycle. Right before the last shift cycle, COPY_BC is set to 1 and the bit value stored in the background scan cell 420 replaces or contributes to replacing the bit value in the main scan cell 410 after going through the weighted insertion circuitry 140.

Figure 5:
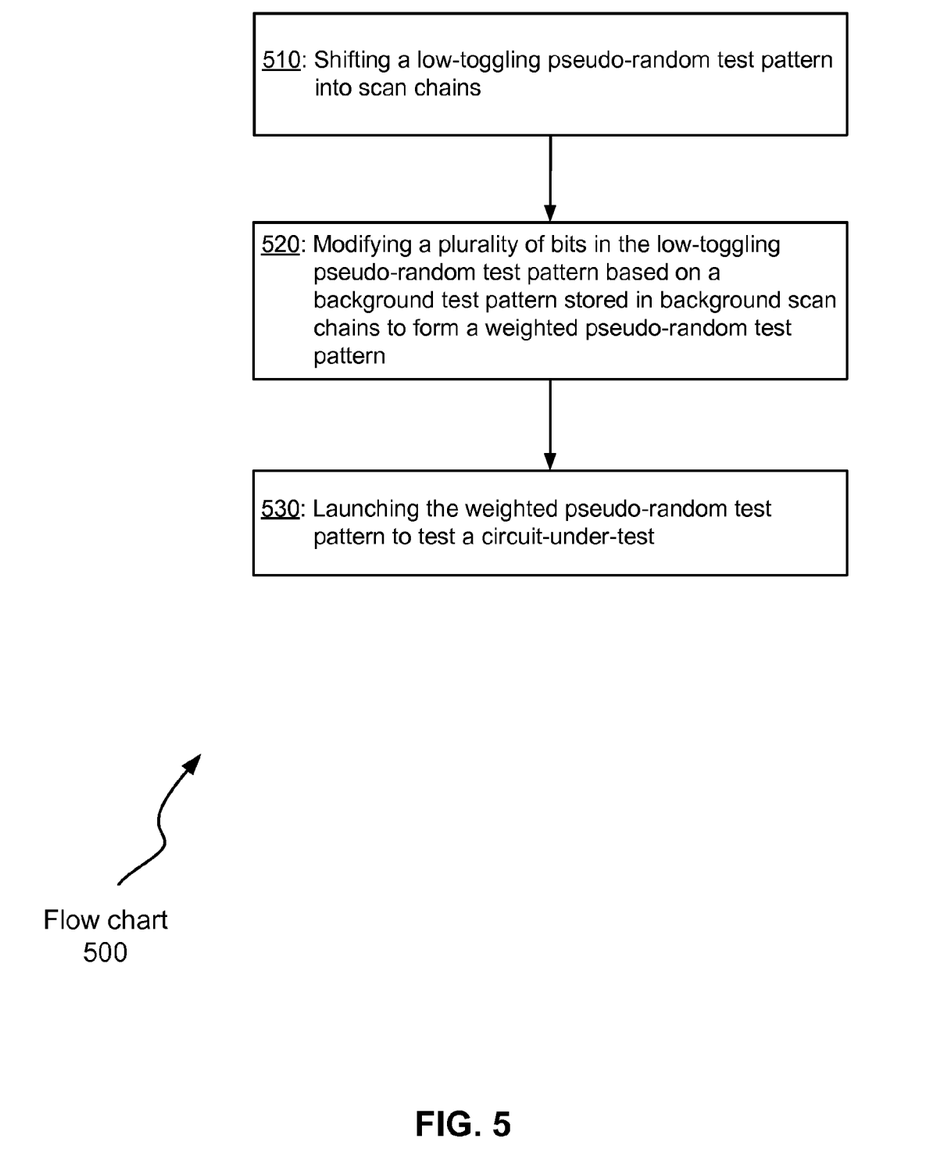
FIG. 5 illustrates a flow chart describing LBIST-based methods that may be employed by various embodiments of the presently disclosed techniques.

FIG. 5 illustrates a flow chart 500 describing LBIST-based methods that may be employed by various embodiments of the presently disclosed techniques. Initially, in operation 510, a low-toggling pseudo-random test pattern is shifted into scan chains. The low-toggling pseudo-random test pattern is generated by low-toggling pseudo-random test pattern generation circuitry. Low-toggling pseudo-random test patterns generated by the low-toggling pseudo-random test pattern generation circuitry cause switching activity during scan shift cycles lower than pseudo-random test patterns generated by a pseudo-random pattern generator. The low-toggling pseudo-random test pattern generation circuitry may comprise a pseudo-random pattern generator and circuitry for converting pseudo-random test patterns generated by the pseudo-random pattern generator to the low-toggling pseudo-random test patterns.

Next, in operation 520, a plurality of bits in the low-toggling pseudo-random test pattern are modified based on a background test pattern stored in background scan chains to form a weighted pseudo-random test pattern. The background test pattern may be generated by a pseudo-random pattern generator. In some embodiments of the presently disclosed techniques, the same pseudo-random pattern generator generates both the background test patterns to be loaded in the background scan chains and the pseudo-random test patterns to be converted to the low-toggling pseudo-random test patterns. With various implementations of the presently disclosed techniques, the background test pattern is shifted into the background scan chains at the same time when the scan chains are loaded.

The plurality of bits may be determined based on weight values obtained based on analyzing fault detection probabilities or deterministic test patterns. The modifying may comprise replacing a bit in the plurality of bits with a bit in the background test pattern if the weight value of the bit is 50% or with a bit outputted from a logic operation that combines two or more bits in the background test pattern if the weight value of the bit is not 50%. The following pseudo code is an example of determining the plurality of bits and their modification operation:

---
Procedure 1: determine_weight_of_a_scan_cell(CNT0, CNT1)
---
// CNT0 and CNT1 are number of specified times to be 0 and 1 in the deterministic test cube set, respectively.
Initialize array W[4]={0.5, 0.75, 0.875, 0.9375}.
Set P=CNT0/(CNT0+CNT1).
If P<0.5, set the bias gate type to be AND and P=1−P. Otherwise, set the bias gate type to be OR.
Find W[i] that is closest to P.
If i equals to 0, connect BC to MSC directly.
If i is greater than 0, apply the bias gate with (i+1) inputs to drive MSC.

---

With various implementations of the presently disclosed techniques, the modifying operation 520 is performed in a last shift cycle of the shifting operation 510.

Next, in operation 530, the weighted pseudo-random test pattern is launched to test a circuit-under-test. The operations 510-530 may be repeated until a predetermined number of weighted pseudo-random test patterns are launched. A test response signature associated with the weighted pseudo-random test patterns may then be analyzed to determine whether the circuit-under-test fails the test.

Figure 6:
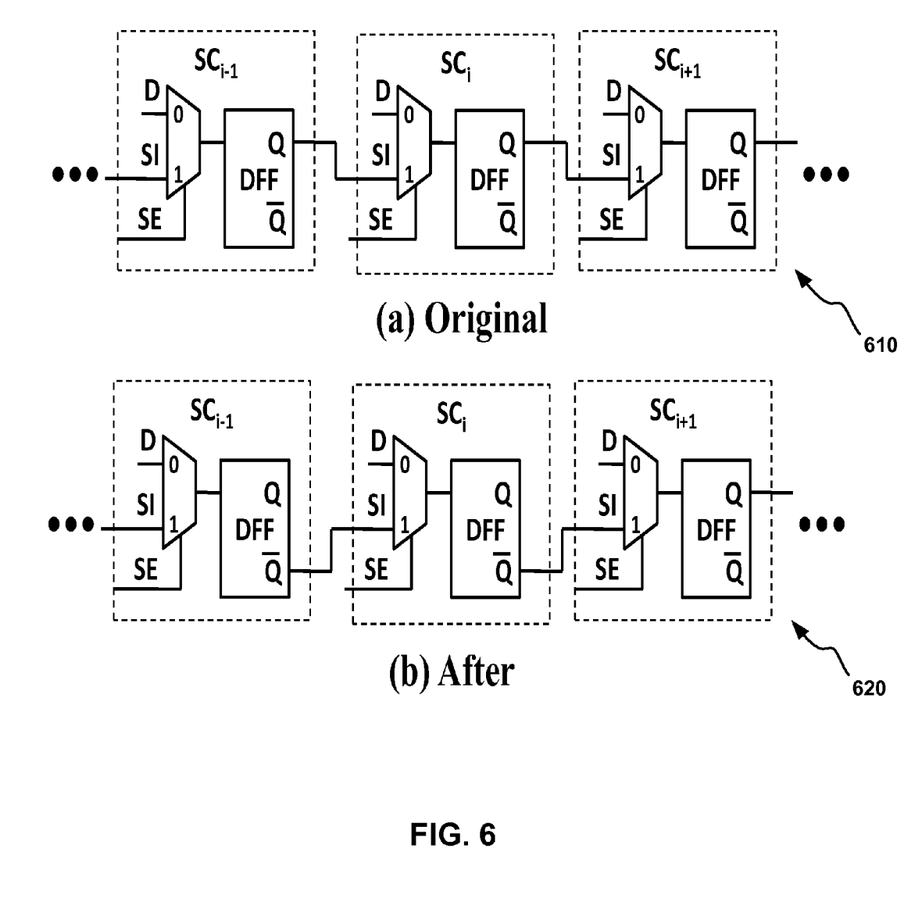
FIG. 6 illustrates an example of an inversion technique for increasing test coverage of LBIST according to various embodiments of the presently disclosed techniques.

FIG. 6 illustrates an example of an inversion technique for increasing test coverage of LBIST according to various embodiments of the presently disclosed techniques. When stitching scan cells into a scan chain, the inversion between a scan cell output and its scan chain input is not important for pseudo-random testing. For any pair of scan cells in the scan chain, the probability of being 00, 01, 10, and 11 is equal. However, if the scan chain is driven by low-toggling pseudo-random test pattern generation circuitry, the probability becomes non-uniform distributed. For example, the low-toggling pseudo-random test pattern generation circuitry shown in FIG. 3 biases the scan cell pair to have higher probability of being 00 and 11 if no inversion exists between scan cell outputs and their scan chain input. Reducing the randomness in the test patterns is the main reason of obtaining lower test coverage for some designs when applying the low-toggling pseudo-random test pattern generation circuitry.

As a person of ordinary skill in the art would appreciate, a deterministic test cube set may bias some test stimulus bits to have either more 1 or more 0. It implies that the probability of being 00, 01, 10, and 11 for a pair of scan cells becomes not the same. To achieve high test coverage, some combinations need to be generated more often. Since the low-toggling pseudo-random test pattern generation circuitry already biases the probability of the combinations at test stimulus bits, these existing biases may be employed to improve the test coverage through adjusting the inversions between scan cell output and scan chain input. For example, if a deterministic test cube set shows 01 and 10 appear more often than 00 and 11 for a given pair of scan cells, $SC_1$ and $SC_2$, we can make $SC_1$ output have inversion with respect to its scan chain input and make $SC_2$ output have no inversion with respect to its scan chain input. Typically, each scan cell has both Q and $\overline{Q}$ outputs. Stitching the scan cells from which output does not introduce extra hardware overhead unless the scan cell is driven by the scan chain input directly, which an extra inverter is needed. In FIG. 6, a scan chain 610 is stitched following a conventional approach and a scan chain 620 is stitched according to various embodiments of the presently disclosed techniques.

The output inversion of a scan cell $SC_i$ may be conducted according to the following rule: 1) If $SC_i$ is driven by scan chain input directly, an inverter is inserted between the scan chain input and the scan input of $SC_i$, and $SC_i/\overline{Q}$ ($SC_i/Q$) is stitched to the scan input of the next scan cell, $SC_{i+1}$, when the original connection is from $SC_i/Q$ ($SC_i/\overline{Q}$); 2) If $SC_i$ is surrounded by other scan cells, the $\overline{Q}(Q)$ output of the previous scan cell, $SC_{i-1}$, is stitched to the scan input of $SC_i$ when the original connection is from the $Q(\overline{Q})$ output of $SC_{i-1}$, and the $\overline{Q}(Q)$ output of $SC_i$, is stitched to the scan input of the next scan cell, $SC_{i+1}$, when the original connection is from $SCi/Q(SCi/\overline{Q})$, as shown in FIGS. 6; and 3) If $SC_i$ is the scan cell driven scan chain output, the $\overline{Q}(Q)$ output of the previous scan cell, $SC_{i-1}$, is stitched to the scan input of SC, when the original connection is from the $Q(\overline{Q})$ output of $SC_{i-1}$.

The following pseudo code is an example of the inversion of a subset of scan cells with respect to their scan chain inputs from a partially specified deterministic test cube set:

---
Procedure 2: determine_inversion(T, P)
---
// T: Test cube set generated by deterministic test generator.
// P: Number of scan cells allowing inversion change.
For every scan cell in the design, count the number of test cubes in T the scan cell has been specified as 0 and 1. Let us denote the count to be SCi0 and SCi1 for the ith scan cell.
Order the scan cells in decreasing order of the sum of SCi0 and SCi1.
Select the top P scan cells in the ordered list.
For (i=1; i<=P; i=i+1), do:
Get the ith scan cell from the selected list.
If SCi1 > SCi0 and there is no inversion between SCi and its scan chain input, mark SCi with inversion change.
If SCi1 < SCi0 and there is inversion between SCi and its scan chain input, mark SCi with inversion change.
Stitch the scan cells in the selected list according to the inversion determined in Step 4.

---

Figure 7:
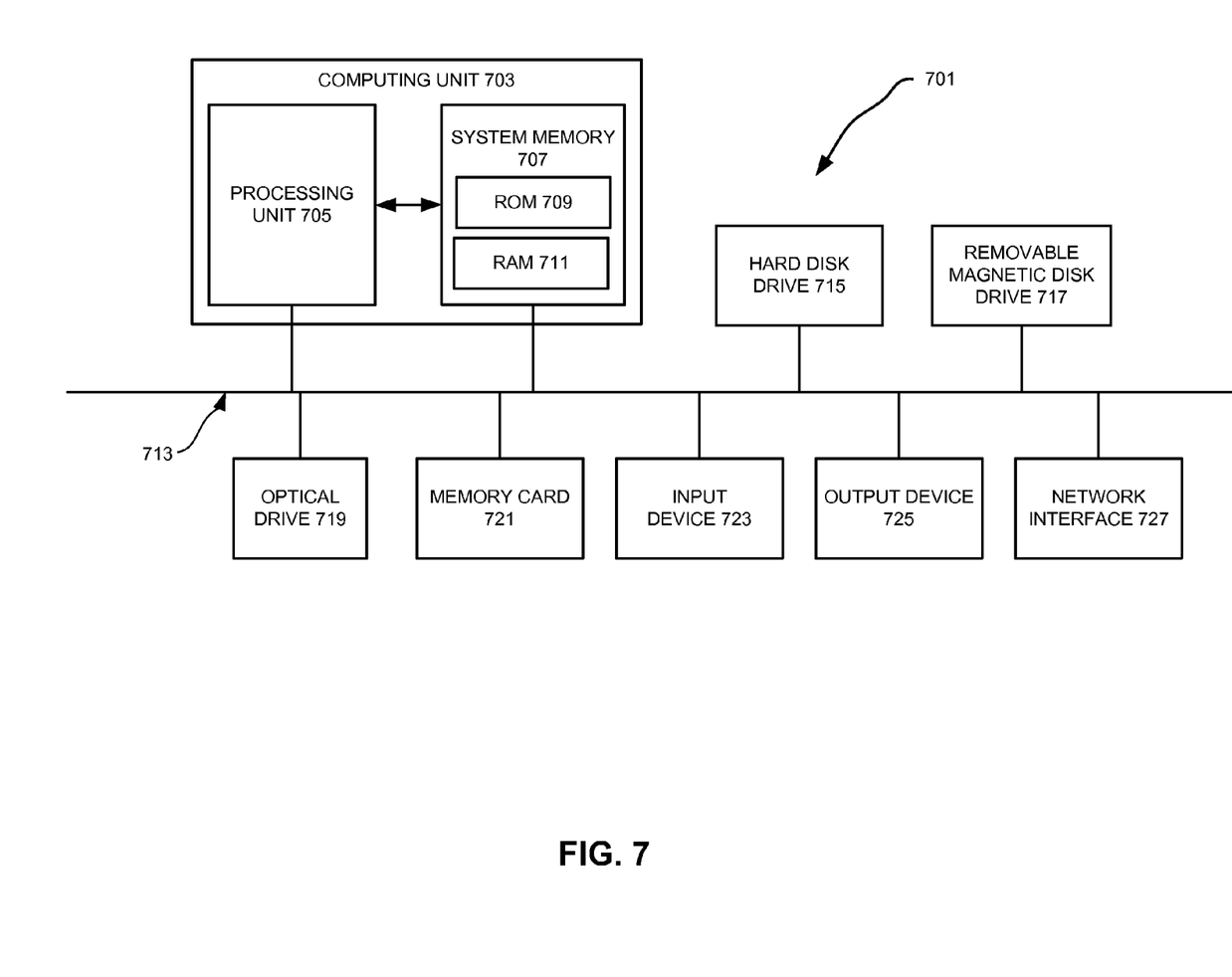
FIG. 7 illustrates a programmable computer system with which various embodiments of the disclosed techniques may be employed.

Various embodiments of the disclosed techniques may be implemented through the execution of software instructions by a computing device, such as a programmable computer. FIG. 7 shows an illustrative example of such a programmable computer (a computing device 701). As seen in this figure, the computing device 701 includes a computing unit 703 with a processing unit 705 and a system memory 707. The processing unit 705 may be any type of programmable electronic device for executing software instructions, but will conventionally be a microprocessor. The system memory 707 may include both a read-only memory (ROM) 709 and a random access memory (RAM) 711. As will be appreciated by those of ordinary skill in the art, both the read-only memory (ROM) 709 and the random access memory (RAM) 711 may store software instructions for execution by the processing unit 705.

The processing unit 705 and the system memory 707 are connected, either directly or indirectly, through a bus 713 or alternate communication structure, to one or more peripheral devices. For example, the processing unit 705 or the system memory 707 may be directly or indirectly connected to one or more additional memory storage devices, such as a "hard"

magnetic disk drive 715, a removable magnetic disk drive 717, an optical disk drive 719, or a flash memory card 721. The processing unit 705 and the system memory 707 also may be directly or indirectly connected to one or more input devices 723 and one or more output devices 725. The input devices 723 may include, for example, a keyboard, a pointing device (such as a mouse, touchpad, stylus, trackball, or joystick), a scanner, a camera, and a microphone. The output devices 725 may include, for example, a monitor display, a printer and speakers. With various examples of the computer 701, one or more of the peripheral devices 715-725 may be internally housed with the computing unit 703. Alternately, one or more of the peripheral devices 715-725 may be external to the housing for the computing unit 703 and connected to the bus 713 through, for example, a Universal Serial Bus (USB) connection.

With some implementations, the computing unit 703 may be directly or indirectly connected to one or more network interfaces 727 for communicating with other devices making up a network. The network interface 727 translates data and control signals from the computing unit 703 into network messages according to one or more communication protocols, such as the transmission control protocol (TCP) and the Internet protocol (IP). Also, the interface 727 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 701 is illustrated as an example only, and it not intended to be limiting. Various embodiments of the disclosed techniques may be implemented using one or more computing devices that include the components of the computer 701 illustrated in FIG. 7, which include only a subset of the components illustrated in FIG. 7, or which include an alternate combination of components, including components that are not shown in FIG. 7. For example, various embodiments of the disclosed techniques may be implemented using a multiprocessor computer, a plurality of single and/or multiprocessor computers arranged into a network, or some combination of both.

Some other embodiments of the disclosed techniques may be implemented by software instructions, stored on a non-transitory computer-readable medium, for causing one or more processors to create a design of the integrated circuit such as the one shown in FIG. 1. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Conclusion

While the disclosed techniques has been described with respect to specific examples including presently preferred modes of carrying out the disclosed techniques, those skilled in the art will appreciate that there are numerous variations and permutations of the above described systems and techniques that fall within the spirit and scope of the disclosed techniques as set forth in the appended claims. For example, while specific terminology has been employed above to refer to electronic design automation processes, it should be appreciated that various examples of the disclosed techniques may be implemented using any desired combination of electronic design automation processes.

What is claimed is:

1. A method, comprising:
    shifting a low-toggling pseudo-random test pattern into scan chains, the low-toggling pseudo-random test pattern being generated by low-toggling pseudo-random test pattern generation circuitry, low-toggling pseudo-random test patterns generated by the low-toggling pseudo-random test pattern generation circuitry causing switching activity during scan shift cycles lower than pseudo-random test patterns generated by a pseudo-random pattern generator;
    modifying a plurality of bits in the low-toggling pseudo-random test pattern based on a background test pattern stored in background scan chains to form a weighted pseudo-random test pattern; and
    launching the weighted pseudo-random test pattern to test a circuit-under-test.

2. The method recited in claim 1, wherein the low-toggling pseudo-random test pattern generation circuitry comprises:
    a pseudo-random pattern generator; and
    circuitry for converting pseudo-random test patterns generated by the pseudo-random pattern generator to the low-toggling pseudo-random test patterns.

3. The method recited in claim 2, wherein the background test pattern is generated by the pseudo-random pattern generator.

4. The method recited in claim 1, wherein the plurality of bits are determined based on weight values obtained based on analyzing fault detection probabilities or deterministic test patterns.

5. The method recited in claim 4, wherein the modifying comprises replacing a bit in the plurality of bits with a bit in the background test pattern if the weight value of the bit is 50% or with a bit outputted from a logic operation that combines two or more bits in the background test pattern if the weight value of the bit is not 50%.

6. The method recited in claim 1, wherein the modifying is performed in a last shift cycle of the shifting.

7. An integrated circuit, comprising:
    low-toggling pseudo-random test pattern generation circuitry, low-toggling pseudo-random test patterns generated by the low-toggling pseudo-random test pattern generation circuitry causing switching activity during scan shift cycles lower than pseudo-random test patterns generated by a pseudo-random pattern generator;
    scan chains configurable to shift in a low-toggling pseudo-random test pattern generated by the low-toggling pseudo-random test pattern generation circuitry;
    background chains configurable to shift in a background test pattern; and
    weight insertion circuitry configurable to modify a plurality of bits in the low-toggling pseudo-random test pattern based on bits in the background test pattern to form a weighted pseudo-random test pattern.

8. The integrated circuit recited in claim 7, wherein the low-toggling pseudo-random test pattern generation circuitry comprises:
    a pseudo-random pattern generator; and
    circuitry for converting pseudo-random test patterns generated by the pseudo-random pattern generator to the low-toggling pseudo-random test patterns.

9. The integrated circuit recited in claim 8, wherein the background test pattern is generated by the pseudo-random pattern generator.

10. The integrated circuit recited in claim 7, wherein the plurality of bits are determined based on weight values obtained based on analyzing fault detection probabilities or deterministic test patterns.

11. The integrated circuit recited in claim 10, wherein the modifying performed by the weight insertion circuitry comprises replacing a bit in the plurality of bits with a bit in the background test pattern if the weight value of the bit is 50% or with a bit outputted from a logic operation that combines two or more bits in the background test pattern if the weight value of the bit is not 50%.

12. The integrated circuit recited in claim 7, wherein the modifying performed by the weight insertion circuitry takes place in a last shift cycle of a shift-in operation of the scan chains.

13. One or more processor-accessible non-transitory storage media storing processor-executable instructions for causing one or more processors to create a design of the integrated circuit, the integrated circuit comprising:
  low-toggling pseudo-random test pattern generation circuitry, low-toggling pseudo-random test patterns generated by the low-toggling pseudo-random test pattern generation circuitry causing switching activity during scan shift cycles lower than pseudo-random test patterns generated by a pseudo-random pattern generator;
  scan chains configurable to shift in a low-toggling pseudo-random test pattern generated by the low-toggling pseudo-random test pattern generation circuitry;
  background chains configurable to shift in a background test pattern; and
  weight insertion circuitry configurable to modify a plurality of bits in the low-toggling pseudo-random test pattern based on bits in the background test pattern to form a weighted pseudo-random test pattern.

14. The one or more processor-accessible media recited in claim 13, wherein the low-toggling pseudo-random test pattern generation circuitry comprises:
  a pseudo-random pattern generator; and
  circuitry for converting pseudo-random test patterns generated by the pseudo-random pattern generator to the low-toggling pseudo-random test patterns.

15. The one or more processor-accessible media recited in claim 14, wherein the background test pattern is generated by the pseudo-random pattern generator.

16. The one or more processor-accessible media recited in claim 13, wherein the plurality of bits are determined based on weight values obtained based on analyzing fault detection probabilities or deterministic test patterns.

17. The one or more processor-accessible media recited in claim 16, wherein the modifying performed by the weight insertion circuitry comprises replacing a bit in the plurality of bits with a bit in the background test pattern if the weight value of the bit is 50% or with a bit outputted from a logic operation that combines two or more bits in the background test pattern if the weight value of the bit is not 50%.

* * * * *